(12) United States Patent
Kikuchi et al.

(10) Patent No.: US 11,029,339 B2
(45) Date of Patent: Jun. 8, 2021

(54) CURRENT MEASURING APPARATUS

(71) Applicant: KOA CORPORATION, Ina (JP)

(72) Inventors: Takanori Kikuchi, Nagano (JP); Keishi Nakamura, Nagano (JP); Susumu Toyoda, Nagano (JP)

(73) Assignee: KOA CORPORATION, Nagano (JP)

( * ) Notice: Subject to any disclaimer, the term of this patent is extended or adjusted under 35 U.S.C. 154(b) by 0 days.

(21) Appl. No.: 16/635,256

(22) PCT Filed: Jul. 10, 2018

(86) PCT No.: PCT/JP2018/026019
§ 371 (c)(1),
(2) Date: Jan. 30, 2020

(87) PCT Pub. No.: WO2019/031140
PCT Pub. Date: Feb. 14, 2019

(65) Prior Publication Data
US 2020/0233015 A1    Jul. 23, 2020

(30) Foreign Application Priority Data

Aug. 10, 2017 (JP) .............. JP2017-155656

(51) Int. Cl.
*G01R 1/20* (2006.01)
*G01R 19/00* (2006.01)

(52) U.S. Cl.
CPC ......... *G01R 1/203* (2013.01); *G01R 19/0023* (2013.01); *G01R 19/0092* (2013.01)

(58) Field of Classification Search
CPC . G01R 1/203; G01R 19/0023; G01R 19/0092
See application file for complete search history.

(56) References Cited

U.S. PATENT DOCUMENTS

| 9,660,404 B2 * | 5/2017 | Kameko ............ H01R 13/46 |
| 2003/0038706 A1 * | 2/2003 | Nakatsu ............ H02M 7/003 338/49 |
| 2005/0258930 A1 * | 11/2005 | Ishida .................. H01C 1/144 338/309 |

(Continued)

FOREIGN PATENT DOCUMENTS

| JP | 48-27745 Y1 | 8/1973 |
| JP | 2016-206137 A | 12/2016 |
| JP | 2016-206138 A | 12/2016 |

OTHER PUBLICATIONS

Microfilm of the specification and drawings annexes to the request of Japanese Utility Model Application No. 44151/1990 (Laid-open No. 4760/1992), (Fuji Electric Co., Ltd.) Jan. 16, 1992.

(Continued)

*Primary Examiner* — Dominic E Hawkins
(74) *Attorney, Agent, or Firm* — Brinks Gilson & Lione

(57) ABSTRACT

Provided is a current measuring apparatus including a current measuring resistor that includes a resistive element and first and second electrodes fixed to the resistive element, the current measuring resistor being adapted to measure a current, and an electronic circuit component including a plurality of terminals. One of the first electrode or the second electrode is used to short at least two of the terminals of the electronic circuit component.

6 Claims, 6 Drawing Sheets

(56) References Cited

U.S. PATENT DOCUMENTS

| | | | | |
|---|---|---|---|---|
| 2009/0174522 A1* | 7/2009 | Schulz | H01C 1/08 | 338/49 |
| 2011/0036712 A1* | 2/2011 | Kusaka | A61B 5/157 | 204/403.01 |
| 2011/0157081 A1* | 6/2011 | Wang | G06F 3/044 | 345/174 |
| 2014/0125429 A1* | 5/2014 | Yoshioka | G01R 1/203 | 333/172 |
| 2015/0108965 A1* | 4/2015 | Sato | G01R 31/364 | 324/120 |
| 2015/0212115 A1* | 7/2015 | Nakamura | H01C 1/14 | 338/332 |
| 2015/0340186 A1* | 11/2015 | Yoneda | H01H 37/767 | 337/412 |
| 2016/0109484 A1* | 4/2016 | Sato | G01R 19/0092 | 324/126 |
| 2017/0003322 A1* | 1/2017 | Nakamura | G01R 15/146 | |
| 2017/0192038 A1* | 7/2017 | Kawamoto | G01R 1/203 | |
| 2017/0271055 A1* | 9/2017 | Harada | G01R 15/146 | |
| 2018/0100877 A1 | 4/2018 | Nakamura et al. | | |
| 2018/0120359 A1 | 5/2018 | Nakamura et al. | | |

OTHER PUBLICATIONS

International Search Report in Application No. PCT/JP2018/026019, dated Sep. 18, 2018, including English Translation, 6 pages.

\* cited by examiner

CURRENT MEASURING APPARATUS

RELATED APPLICATIONS

The present application is a 371 application of PCT/JP2018/026019 having an international filing date of Jul. 10, 2018, which claims priority to JP2017-155656 filed Aug. 10, 2017, the entire content of each of which is incorporated herein by reference.

TECHNICAL FIELD

The present invention relates to current measuring apparatuses.

BACKGROUND ART

Using high-speed diodes with high performance is necessary to save energy and resources in and increase the reliability of an inverter power supply apparatus. For example, there is known a packaged product including two diodes as an SOT-227 package. Such a product is provided with four terminals.

Conventionally, such a packaged component is sometimes used with two of its four terminals intentionally shorted depending on its use. To that end, a shorting bar for shorting the two terminals is used. Further, a shunt resistor for sensing a current flow through such a packaged component is sometimes coupled thereto.

Patent Literature 1 discloses a technique of forming one of terminals of a shunt resistor longer than the other, thereby reducing contact resistance and the like as compared to when a plurality of bus bars is used.

CITATION LIST

Patent Literature

Patent Literature 1: JP 2016-206138 A

SUMMARY OF INVENTION

Technical Problem

The shunt resistor disclosed in Patent Literature 1 has a structure in which one of its terminals is longer than the other, and the longer terminal is fixed to a fixation portion of a package (i.e., housing) or the like via a single fixation hole.

However, Patent Literature 1 fails to disclose how to fix terminals to the housing when two terminals are located on the side of the package.

It is an object of the present invention to provide a current sensing resistor that is suited to short two terminals of a predetermined electronic circuit component having a plurality of terminals and sense a current flow therethrough, and a current measuring apparatus including such a current sensing resistor.

According to an aspect of the present invention, a current measuring apparatus is provided that includes a current measuring resistor including a resistive element and first and second electrodes fixed to the resistive element, the current measuring resistor being adapted to measure a current, and an electronic circuit component including a plurality of terminals, in which one of the first electrode or the second electrode is used to short at least two of the terminals of the electronic circuit component.

The electronic circuit component is preferably packaged. The package is an SOT 227 package, for example.

The plurality of terminals preferably includes a terminal coupled to a semiconductor device packaged in the electronic circuit component.

At least one of the first electrode or the second electrode of the current measuring resistor includes two or more through-holes.

At least one of the first electrode or the second electrode of the current measuring resistor includes an elongated through-hole.

A plurality of electronic components is disposed in the package, and at least one of the first electrode or the second electrode is used to short the two terminals, thereby forming a parallel circuit or a series circuit of the electronic components.

In addition, the present invention provides a current measuring resistor including a resistive element and first and second electrodes fixed to the resistive element, the current measuring resistor being adapted to measure a current, in which at least one of the first electrode or the second electrode includes two or more through-holes.

In addition, the present invention provides a current measuring resistor including a resistive element and first and second electrodes fixed to the resistive element, the current measuring resistor being adapted to measure a current, in which at least one of the first electrode or the second electrode includes an elongated through-hole.

The present specification incorporates the disclosure of JP Patent Application No. 2017-155656 that forms the basis of the priority claim of the present application.

Advantageous Effects of Invention

The present invention can provide a current sensing resistor that is suited to short two terminals of a package and sense a current flow therethrough, and a current measuring apparatus including the same.

DESCRIPTION OF EMBODIMENTS

Hereinafter, a current measuring resistor (i.e., shunt resistor) and a current measuring apparatus including the same according to an embodiment of the present invention will be described in detail with reference to the drawings.

In this specification, a direction in which electrodes are arranged at opposite ends of a resistive element shall be referred to as a "length direction" and a direction intersecting the length direction shall be referred to as a "width direction."

First Embodiment

Figure 1:
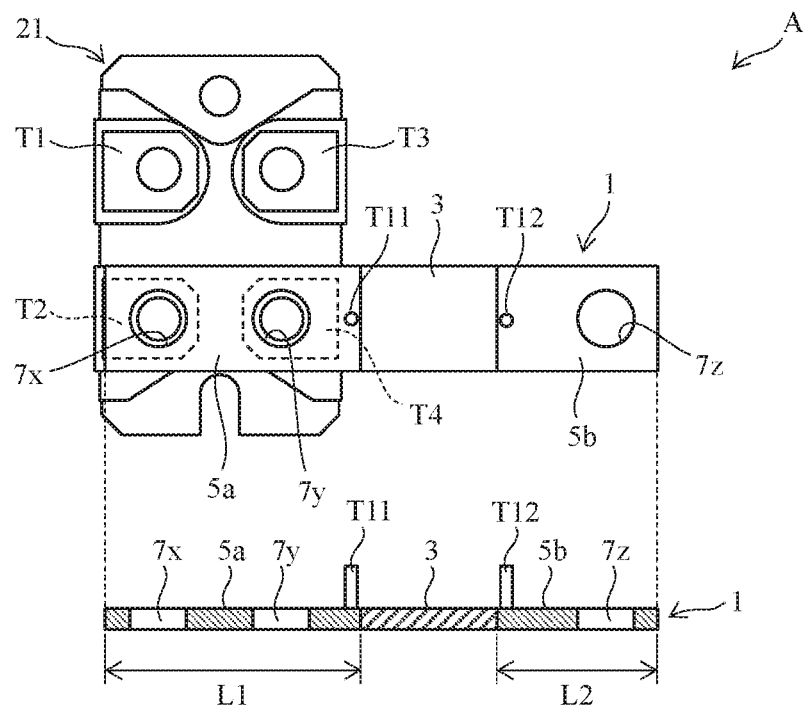
FIG. 1 is a plan view of an exemplary configuration of a current measuring resistor and a current measuring apparatus including the same according to a first embodiment of the present invention, and a cross-sectional view of the shunt resistor.
Figure 2:
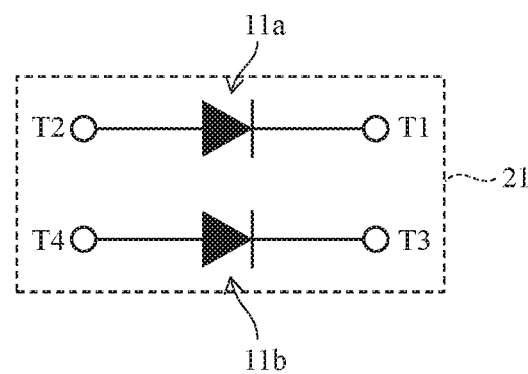
FIG. 2 is an equivalent circuit diagram of an SOT 227 package.
Figure 3:
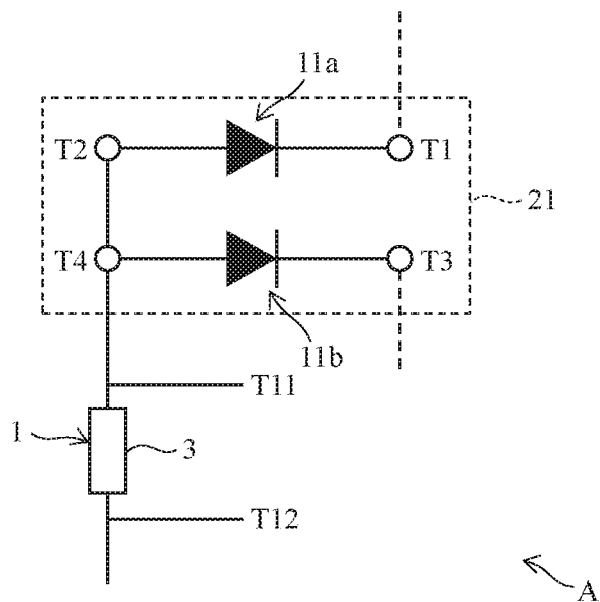
FIG. 3 is an equivalent circuit diagram of FIG. 1.

First, a first embodiment of the present invention will be described. FIG. 1 is a plan view of an exemplary configuration of a current measuring resistor and a current measuring apparatus including the same according to the present embodiment, and a cross-sectional view of the shunt resistor. A current measuring apparatus A illustrated in FIG. 1 includes a shunt resistor 1 and an SOT 227 package 21 as an exemplary electronic circuit component, for example. FIG. 2 is an equivalent circuit diagram of the package 21, and FIG. 3 is an equivalent circuit diagram of FIG. 1.

As illustrated in FIGS. 1 and 2, the package 21 has four terminals including a terminal T1 to a terminal T4. A diode device 11a is arranged between the terminal T1 and the terminal T2. Also, a diode device 11b is arranged between the terminal T3 and the terminal T4 in the forward direction like the diode device 11a. The two diode devices may also be arranged in opposite directions. That is, the two diode devices may be arranged in parallel in the forward direction and the reverse direction, respectively. Although this example describes the SOT 227 package including packaged diode devices, the configuration of the package and the elements incorporated therein are not limited thereto, and a variety of examples, such as switching elements, are considered.

The shunt resistor 1 illustrated in FIG. 1 includes a resistive element 3 and a first electrode 5a and a second electrode 5b on opposite sides thereof. Terminals T11 and T12 for sensing a voltage are arranged around portions where the electrodes 5a and 5b are coupled to the resistive element 3, respectively. The terminals T11 and T12 are omitted in some of the other drawings. The shunt resistor 1 illustrated herein is a resistor with a so-called butt-joint structure that is obtained by butt-joining the resistive element and the electrodes together at end faces of their metal materials, but the structure of the shunt resistor 1 is not limited thereto.

For the resistive element 3, a metal plate material, such as a Cu—Ni, Cu—Mn, or Ni—Cr-based material, can be used. For the electrodes, a material, such as Cu, can be used.

In the shunt resistor 1, the length L1 of the first electrode 5a is greater than the length L2 of the second electrode 5b. Each of the first electrode 5a and the second electrode 5b is provided with a fixation hole through which the package 21 and the shunt resistor 1 are adapted to be fixed together. The first electrode 5a is provided with two fixation holes 7x and 7y. The second electrode 5b is provided with one fixation hole 7z.

As illustrated in FIGS. 1 and 3, in the current measuring apparatus according to the present embodiment, the terminal T2 of the package 21 is fastened to the shunt resistor 1 with a screw via the fixation hole 7x in the first electrode 5a of the shunt resistor 1, for example. In addition, the terminal T4 of the package 21 is fastened to the shunt resistor 1 with a screw via the fixation hole 7y in the first electrode 5a of the shunt resistor 1, for example.

FIG. 3 illustrates an equivalent circuit diagram of the current measuring apparatus A illustrated in FIG. 1. That is, the terminal T2 and the terminal T4 are shorted.

A current flow through the package 21 can be measured from a voltage across the terminals T11 and T12 sandwiching the resistive element 3 of the shunt resistor 1.

Figure 4:
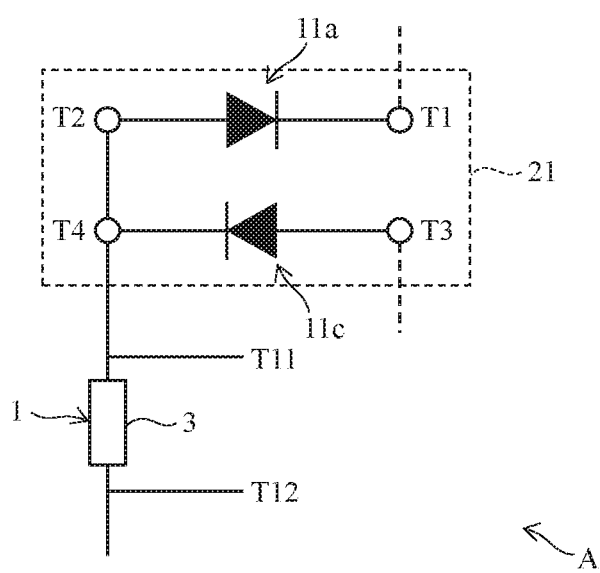
FIG. 4 is a circuit diagram of the modified example of FIG. 3.

It should be noted that a current flow through the package 21 can be similarly measured using a configuration in which the diode device 11a and the diode device 11c are arranged in opposite directions as illustrated in FIG. 4.

Figure 5A:
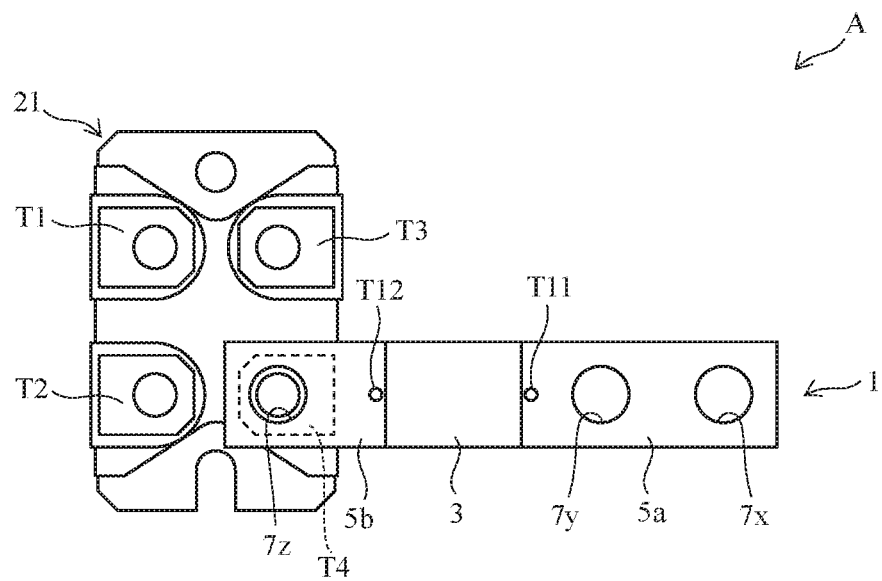
FIGS. 5A and 5B are plan views of the modified examples of FIG. 1.
Figure 5B:
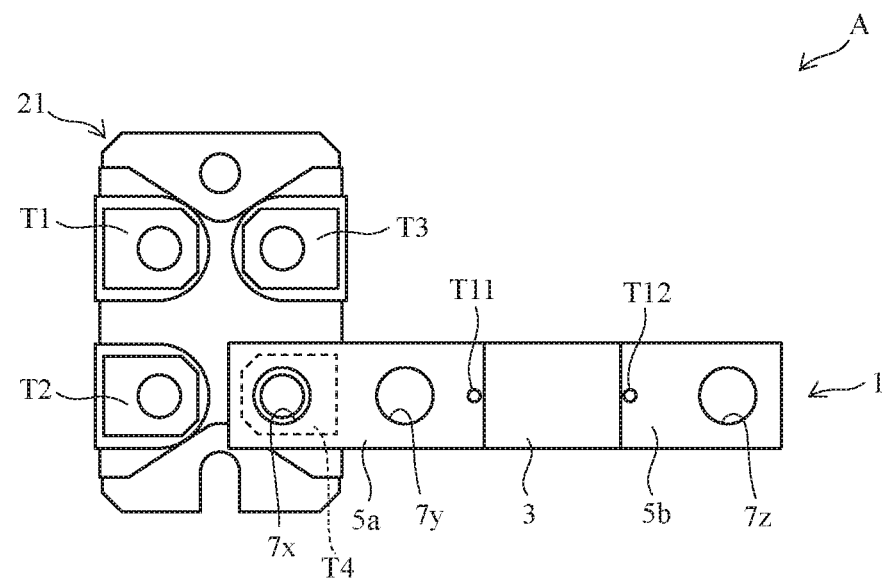

In the configuration illustrated in FIG. 1, in order not to short the terminals of the package 21, the position of the shunt resistor 1 may be inverted from that in FIG. 1 as illustrated in FIG. 5A so that the fixation hole 7z is fixed to the terminal T4 (i.e., the shunt resistor located in the lower position), or the position of the shunt resistor 1 may be shifted in the horizontal direction as illustrated in FIG. 5B so that the fixation hole 7x is fixed to the terminal T4.

Figure 6A:
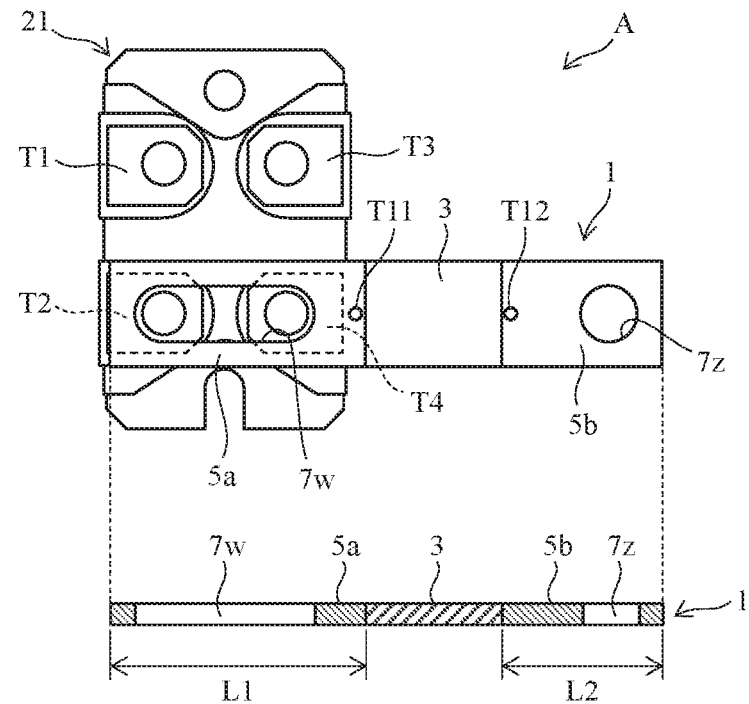
FIGS. 6AA and 6AB are plan views of the modified examples of FIGS. 5A and 5B, and a cross-sectional view of the shunt resistor.
Figure 6A:
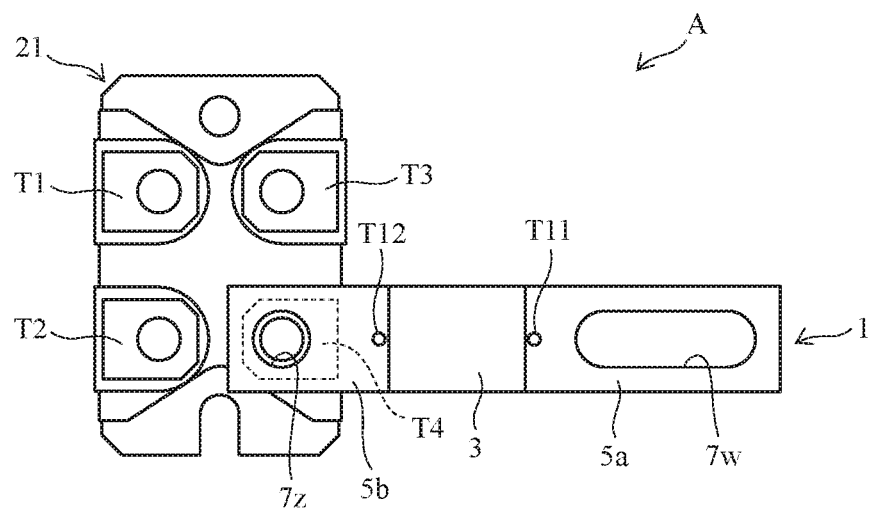

In addition, as illustrated in FIG. 6AA, one of the electrodes (5a) of the shunt resistor 1 may have formed therein an elongated hole 7w with an elliptical shape that is long in the length direction so that the two terminals T2 and T4 of the package 21 are fixed through the elongated hole 7w.

Further, as illustrated in FIGS. 6AB and 6BC, the shunt resistor 1 with the elongated hole illustrated in FIG. 6AA may be used while the position of the shunt resistor 1 is inverted so that the elongated hole 7w is disposed on the right side of FIG. 6AB, or the position of the elongated hole 7w may be shifted in the horizontal direction.

Figure 6B:
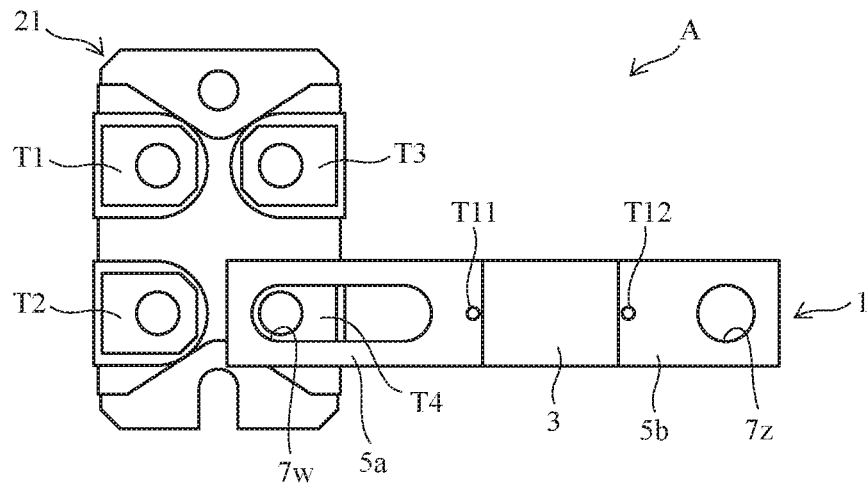
FIG. 6BC is a plan view of the modified example of FIG. 6AA, FIG. 6BD is a plan view and a cross-sectional view of another example of the shunt resistor, and FIG. 6BE is a plan view of an implementation of the shunt resistor in FIG. 6BD.
Figure 6B:
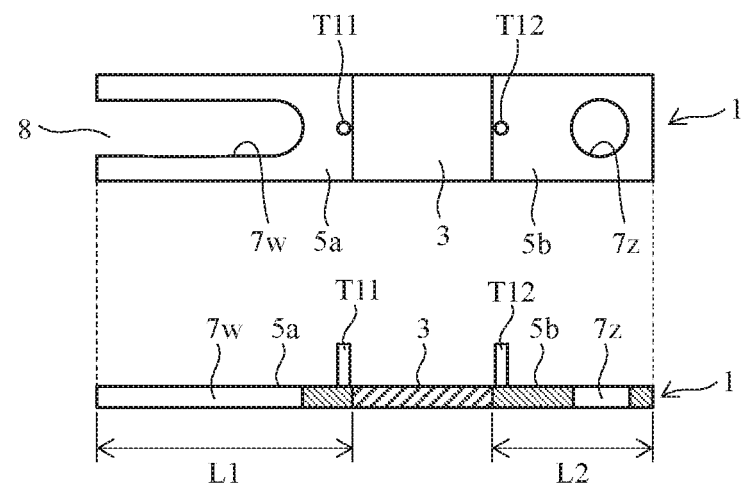
Figure 6B:
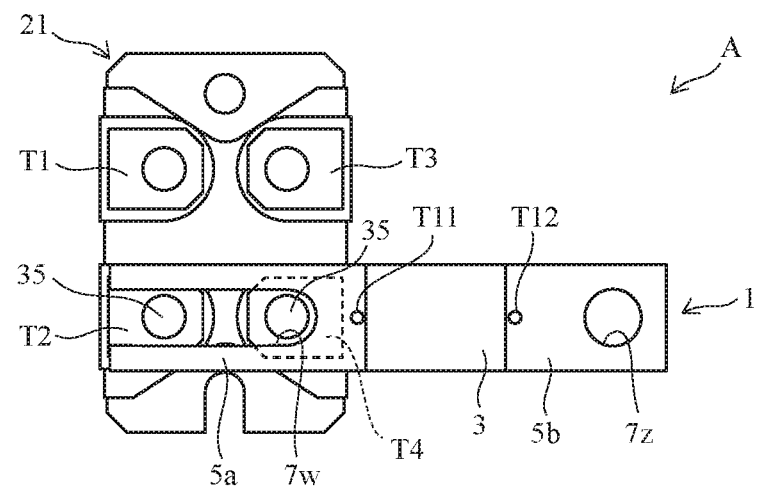

FIG. 6BD is a plan view of another example of the shunt resistor 1. In the example, the elongated hole 7w is formed penetrating through the electrode 5a. A part of the elongated hole 7w has an opening 8 formed at an end of the electrode 5a. The other configurations are similar to those of the other examples.

FIG. 6BE illustrates an implementation of the shunt resistor in FIG. 6BD. In the present implementation, the terminals T2 and T4 of the package 21 are shorted by the electrode 5a. In addition, the shunt resistor 1 may be slid so as to be coupled to the package 21 as illustrated in FIG. 6BC. The elongated hole 7w has the opening 8. Therefore, when the shunt resistor or a wire (not illustrated) is fastened to the package 21 using bolts (not illustrated) through the threaded holes 35 of the terminals T2 and T4, the bolts may be temporarily fixed in the threaded holes 35 so that the electrode 5a of the shunt resistor 1 may be slid between the flange heads of the bolts and the terminals T2 and T4 from the lateral side. This allows the shunt resistor to be easily installed.

As described above, to sense a current using a shunt resistor, it has been necessary to prepare two parts including a shunt resistor to be used for sensing a current, and a shorting bar for shorting two terminals. In contrast, providing two threaded holes or an elongated elliptical hole in an electrode on the side to be coupled to the package can add the function of a shorting bar for shorting two terminals to the shunt resistor for sensing a current. Meanwhile, even when the two terminals need not be shorted, shifting or inverting the shunt resistor allows the shunt resistor to be used as the same shunt resistor.

Second Embodiment

As the development of power semiconductors, such as SiC and GaN, progresses, a semiconductor chip may sometimes be used with its upper face directly coupled to a copper wire in the shape of a lead frame. Providing such a lead frame with some functions is also useful from the perspective of reducing the size of the apparatus. The present embodiment relates to a structure obtained by applying the present invention to sensing of a current that is controlled with such a power semiconductor.

Figure 7:
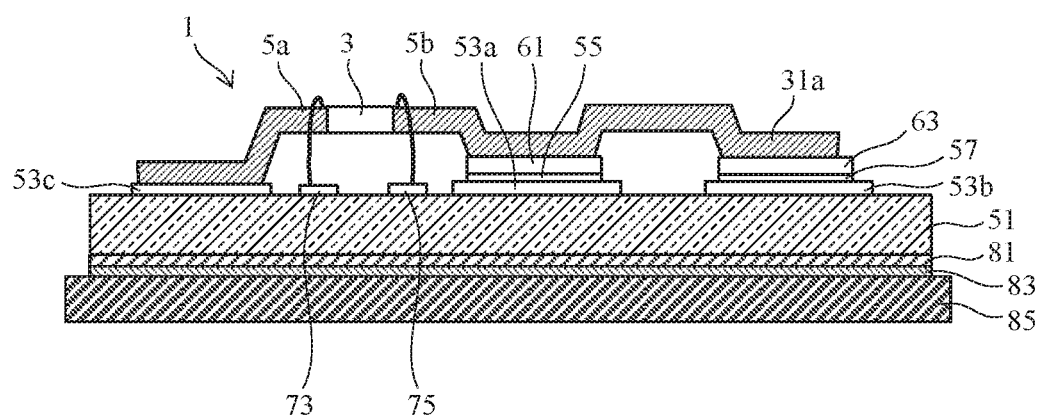
FIG. 7 is a cross-sectional view of an exemplary configuration of a lead frame-integrated shunt resistor of the present embodiment according to a second embodiment of the present invention.
Figure 8:
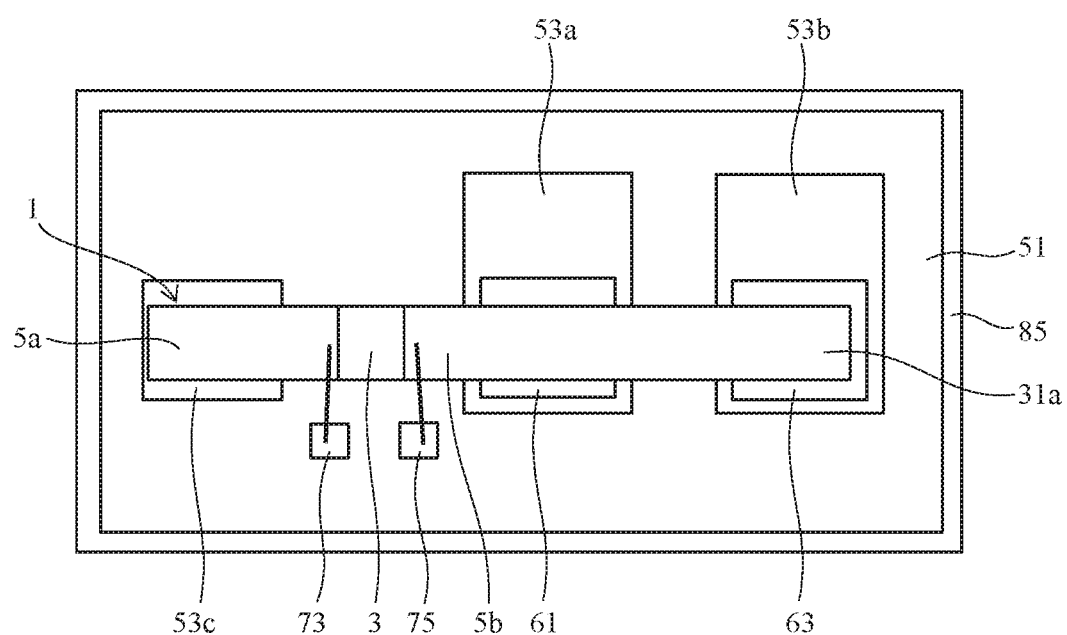
FIG. 8 is a plan view of FIG. 7.

FIG. 7 is a cross-sectional view of an exemplary configuration of a power module as an exemplary electronic circuit component including the shunt resistor according to the present embodiment, and FIG. 8 is a plan view thereof. As illustrated in FIGS. 7 and 8, the lead frame-integrated shunt resistor according to the present embodiment includes a shunt portion (i.e., left side in the drawing) and a shorted portion (i.e., right side in the drawing) provided in the package.

The structure of the power module will be described in more detail.

The first wire 53a, the second wire 53b, and the third wire 53c are provided on a ceramic substrate 51. The first wire 53a is provided with a first semiconductor device 61 with a conductive adhesive 55 interposed therebetween. The second wire 53b is provided with a second semiconductor device 63 with a conductive adhesive 57 interposed therebetween. The adhesive is a fixing agent for packaging, and is adapted to fix the semiconductor devices to a circuit pattern. Examples include solder, sintered Cu, and sintered Ag.

Meanwhile, the lower face of the ceramic substrate 51 has a metal layer 81 formed thereon, and the metal layer 81 is further coupled to a radiator plate 85 via an adhesive 83.

In addition, a copper wire 31a in the shape of a lead frame is disposed between the first wire 53a and the second wire 53b. The shunt resistor 1 in the shape of a lead frame is also disposed between the first wire 53a and the third wire 53c. The shunt resistor 1 includes a resistive element 3 and electrodes 5a and 5b at opposite ends thereof as in the first embodiment. The wire 31a partially forms the electrode 5a, and a portion where the electrode 5a is coupled to the first wire 53a and the second wire 53b corresponds to the wire 31a. The wire 31a is coupled to the first wire 53a and the second wire 53b via the semiconductor devices 61 and 63, respectively. Each of the semiconductor devices 61 and 63 has a terminal coupled to the first wire 53a or the second wire 53b, and a terminal coupled to the wire 31a, The wire 31a and a wire on the side of the substrate (i.e., a terminal functioning as a portion to be coupled of the wire) may be directly coupled together without the intermediary of any semiconductor device. The wire 31a and the terminal are coupled together using solder, an electrically conducting adhesive, or the like. It should be noted that in the drawing, other electrical elements (i.e., microcomputer), wire patterns, external connection electrodes, an external package, and the like are omitted.

Further, wires 73 and 75 are coupled to the electrodes 5a and 5b around the resistive element 3, respectively, with bonding wires.

As described above, when the shunt resistor 1 is subjected to surface treatment and is coupled to the wires 73 and 75 by wire bonding, for example, so as to be able to sense a voltage, it becomes possible to directly send a signal to a portion Where a voltage signal is needed. Among the structure of the shunt resistor 1, the electrode 5b as one of the electrodes functions to short the terminals of the chips of the first and second semiconductors 61 and 63. The other electrode 5a is coupled to the third wire 53c forming a current path. The shunt resistor 1 is formed in the shape of a thin plate, and has a plurality of bent portions. This can absorb stress due to thermal shrinkage of the substrate, and thus enables stable electrical connection. The shunt resistor 1 need not have such bent portions depending on the materials of the substrate, use conditions, and the like.

As described above, according to the present embodiment, a current to be monitored is flowed through the shunt resistor 1 (i.e., a resistor with a low resistance value that is less than or equal to several mΩ), and a voltage generated across the electrodes 5a and 5b at opposite ends of the shunt resistor 1 is measured. The shunt resistor 1 can be used for a current measuring apparatus that senses a current from a known resistance value, and has the following advantageous effects.

A substrate specifically designed to radiate heat is used for a module for controlling a large current, which is called an IPM (intelligent power module). A plurality of power semiconductors is mounted on the substrate.

To couple the power semiconductors to the substrate, radiation of heat should be fully considered. Therefore, wires for current are not provided on the substrate but the upper faces of the chips are directly coupled together with a copper frame in the shape of a lead frame. Thus, using a part of the copper plate in the shape of a lead frame as a shunt resistor can add a current sensing function to the copper wire other than the function of an electric wire and thus can reduce the number of components. A single shunt resistor can be used to electrically couple two terminals of an electronic circuit component that includes at least three terminals, and measure a current flow between terminals other than the two terminals.

In the aforementioned embodiment, the configurations and the like illustrated in the drawings are not limited thereto and can be changed as appropriate within the range that the advantageous effects of the present invention can be exerted. Besides, the present invention can be implemented with the configurations and the like changed as appropriate without departing from the object of the present invention.

The constituent elements of the present invention can be freely selected or not selected, and an invention including the selected configurations is included in the present invention.

INDUSTRIAL APPLICABILITY

The present invention is applicable to current measuring apparatuses used for a variety of electrical apparatuses.

All publications, patents, and patent applications cited in this specification are incorporated herein by reference in their entirety.

The invention claimed is:

1. A current measuring apparatus comprising:
a current measuring resistor including a resistive element and first and second electrodes fixed to the resistive element, the current measuring resistor being adapted to measure a current; and
an electronic circuit component including a plurality of terminals,
wherein:
one of the first electrode or the second electrode is used to short at least two of the terminals of the electronic circuit component.

2. The current measuring apparatus according to claim 1, wherein the electronic circuit component is packaged.

3. The current measuring apparatus according to claim 1, wherein the plurality of terminals includes a terminal coupled to a semiconductor device packaged in the electronic circuit component.

4. The current measuring apparatus according to claim 1, wherein at least one of the first electrode or the second electrode of the current measuring resistor includes two or more through-holes.

5. The current measuring apparatus according to claim 1, wherein at least one of the first electrode or the second electrode of the current measuring resistor includes an elongated through-hole.

6. The current measuring apparatus according to claim 1, wherein
   a plurality of electronic components is disposed, and
   at least one of the first electrode or the second electrode is used to short the two terminals, thereby forming a parallel circuit or a series circuit of the electronic components.

* * * * *